(12) United States Patent
Stave

(10) Patent No.: US 11,494,323 B2
(45) Date of Patent: *Nov. 8, 2022

(54) ADDRESSING SCHEME FOR A MEMORY SYSTEM

(71) Applicant: Micron Technology, Inc., Boise, ID (US)

(72) Inventor: Eric J. Stave, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/387,319

(22) Filed: Jul. 28, 2021

(65) Prior Publication Data

US 2022/0058145 A1 Feb. 24, 2022

Related U.S. Application Data

(63) Continuation of application No. 16/744,091, filed on Jan. 15, 2020, now Pat. No. 11,080,219.

(51) Int. Cl.
| | |
|---|---|
| *G06F 13/16* | (2006.01) |
| *G06F 13/40* | (2006.01) |
| *G11C 11/4076* | (2006.01) |
| *G11C 11/4074* | (2006.01) |
| *G11C 11/4072* | (2006.01) |

(52) U.S. Cl.
CPC ........ *G06F 13/1694* (2013.01); *G06F 13/404* (2013.01); *G11C 11/4072* (2013.01); *G11C 11/4074* (2013.01); *G11C 11/4076* (2013.01)

(58) Field of Classification Search
CPC .............. G06F 13/1694; G06F 13/404; G11C 11/4072; G11C 11/4074; G11C 11/4076; G11C 5/04; G11C 7/10; G11C 8/12; G11C 11/408

See application file for complete search history.

(56) References Cited

U.S. PATENT DOCUMENTS

| | | | |
|---|---|---|---|
| 9,209,160 B2 | 12/2015 | Lee | |
| 9,519,020 B2 | 12/2016 | Ko et al. | |
| 9,805,769 B2 | 10/2017 | Lee et al. | |
| 11,080,219 B1* | 8/2021 | Stave | .................. G11C 11/4074 |
| 2008/0043565 A1 | 2/2008 | Cullum et al. | |
| 2016/0124851 A1 | 5/2016 | Cho | |
| 2019/0188162 A1 | 6/2019 | Kwon et al. | |
| 2020/0133903 A1 | 4/2020 | Chen et al. | |

* cited by examiner

*Primary Examiner* — Tri M Hoang
(74) *Attorney, Agent, or Firm* — Holland & Hart LLP

(57) ABSTRACT

Methods, systems, and devices for addressing scheme for a memory system are described. A memory system may include a plurality of memory devices that are coupled with various command address (CA) channels via respective pins. In some examples, different pins of each memory device may be coupled with different CA channels. When the memory system receives a command to enter a memory device into a per-device addressability (PDA) mode, certain CA channels may be driven. One or more memory devices may enter the PDA mode based on certain pins of the respective memory device being biased.

20 Claims, 6 Drawing Sheets

ADDRESSING SCHEME FOR A MEMORY SYSTEM

CROSS REFERENCE

The present Application for Patent is a continuation of U.S. Pat. No. 11,080,219 by Stave, entitled "ADDRESSING SCHEME FOR A MEMORY SYSTEM," filed Jan. 15, 2020, assigned to the assignee hereof, and is expressly incorporated by reference in its entirety herein.

BACKGROUND

The following relates generally to one or more memory systems and more specifically to addressing scheme for a memory system.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
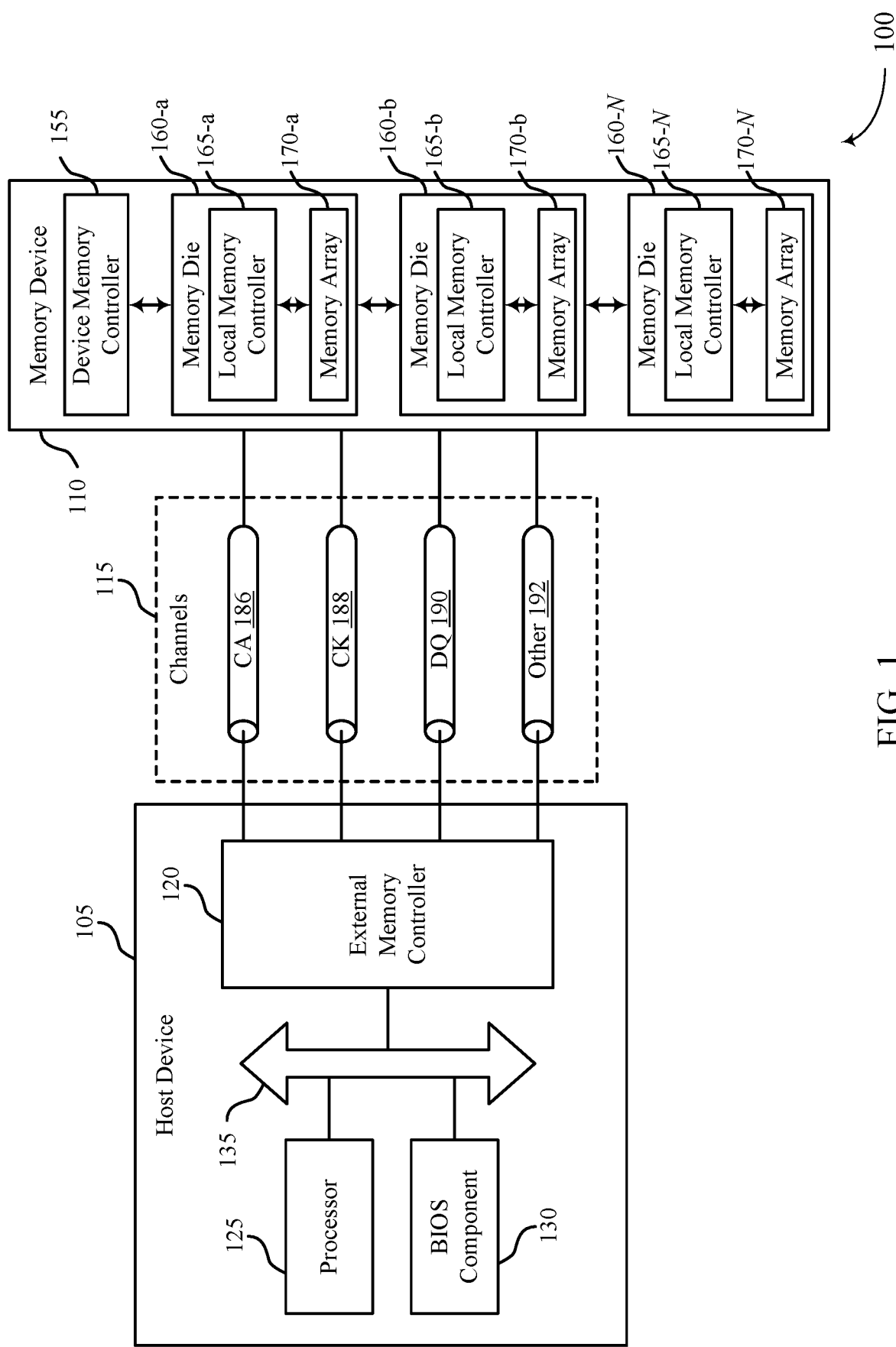
FIG. 1 illustrates an example of a system that supports addressing scheme for a memory system in accordance with examples as disclosed herein.

Some memory systems may include more than one memory device (e.g., DRAM device). In such memory systems, individual memory devices may be addressed and/or accesses using a per-device-addressability (PDA). When in a PDA mode, a memory device may be accessed independent of the other memory devices in the system. In traditional memory systems, a memory device (or memory devices) may enter into a PDA mode by transmitting a first command over a command/address (CA) channel while an additional channel (e.g., a DQ channel) is biased. Utilizing multiple channels (e.g., CA channels and DQ channels) to enter a memory device into a PDA mode may use coordination between the signals, which may use additional circuitry and/or additional bandwidth of the memory system. Accordingly, a memory system that allows memory devices to enter into a PDA mode without coordinating multiple signal paths may be desirable.

Methods, devices, and systems for entering memory devices into a PDA mode without coordinating multiple signal paths are described herein. A memory system may include multiple memory devices (e.g., DRAM devices) that are coupled with signal paths (e.g., channels) of the CA channel. Each memory device may include one or more pins for communicating signals with the signal paths of the CA channel. The pins may be located in a same location of each memory device. During manufacturing, different signal paths of the CA channel may be coupled with different pin locations of each memory device (e.g., the mapping between pins and channels may be scrambled).

Each memory device in the memory system may be configured to look for a specific pattern of pins to be biased before entering the PDA mode. In such a manner, the memory device may receive a PDA mode command (e.g., from a host device), which may result in a unique pattern of signal paths being driven. Based on the pattern of signal paths being driven, pins of different memory devices may be biased (e.g., driven to a nonzero voltage level) based on how the pins of each memory device are coupled with the signal paths. When a particular configuration of pins of one memory device is biased, the memory device may enter into a PDA mode. When in PDA mode, a memory device may be able to receive device-specific commands (e.g., access commands). By entering a device into PDA mode using only the CA channel, a memory system may avoid coordinating multiple signal paths, thus reducing the amount of circuitry and/or bandwidth otherwise used. In some cases, a PDA mode may be an example of a per-DRAM-addressability mode.

Features of the disclosure are initially described in the context of a memory system as described with reference to FIG. 1. Features of the disclosure are described in the context of a memory system and flow diagram as described with reference to FIGS. 2 and 3. These and other features of the disclosure are further illustrated by and described with reference to an apparatus diagram and flowcharts that relate to addressing scheme for a memory system as described with references to FIGS. 4-6.

FIG. 1 illustrates an example of a system 100 that supports addressing scheme for a memory system in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands. In other examples, the memory device 110 may receive a PDA entry command from the host device 105. The PDA entry command may allow the memory device 110 to exclusively receive commands from the host device 105. In some examples, when in a PDA mode, the memory device 110 may receive commands exclusively until the PDA mode is exited.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more CA channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, the CA channel 186 may include a read command with an address of the desired data. In some examples, a CA channel 186 may include any number of signal paths to decode one or more of address or command data (e.g., eight or nine signal paths). The CA channels 186 may also be configured to communicate a PDA entry command to the memory device 110. The PDA command may be communicated via a subset (e.g., a first subset) of the CA channels 186, and an address may be communicated via a subset (e.g., a second subset) of the CA channels 186. The address may be communicated to the memory device 110 based on a configuration of pins that are coupled with certain CA channels 186.

As discussed herein, the memory device 110 may include one or more pins (e.g., address pins). During manufacturing, some pins may be coupled with CA channels 186 in a unique configuration. For example, the system 100 may include multiple memory devices 110, and different pins (e.g., a different combination of pin locations) of each memory device 110 may be coupled with different CA channels 186. When the memory device 110 is initialized, a mapping between pins (e.g., pin locations) and CA channels 186 may be determined. The mapping may be determined by, for example, the device memory controller 155.

The host device 105 may initiate a PDA mode for the memory device 110 using signals communicated over a CA channel 186 based on a scrambling of connections between pin locations of a memory device and the signal paths of the CA channel 186. When in PDA mode, the memory device 110 may be associated with a unique address (e.g., a memory device address), which may allow the memory device 110 to be independently accessed. Thus the system 100 may include multiple memory devices and the devices in PDA mode may respond to commands associated with the PDA mode. To enter a memory device 110 into a PDA mode, the host device 105 may transmit a PDA entry command. The command may be transmitted via the CA channels 186, and may include command and addressing information. The command may initiate driving a unique combination of CA channels 186. Because the CA channels 186 are coupled with a unique combination of pins of each memory device 110 (e.g., based on a scrambling configuration), the memory device (or memory devices) having certain pins biased (based on driving the CA channels 186) may enter a PDA mode. Thus, memory devices can be uniquely addressed based on mapping between pins (e.g., pin locations) and the signal paths of the CA channels 186.

Figure 2:
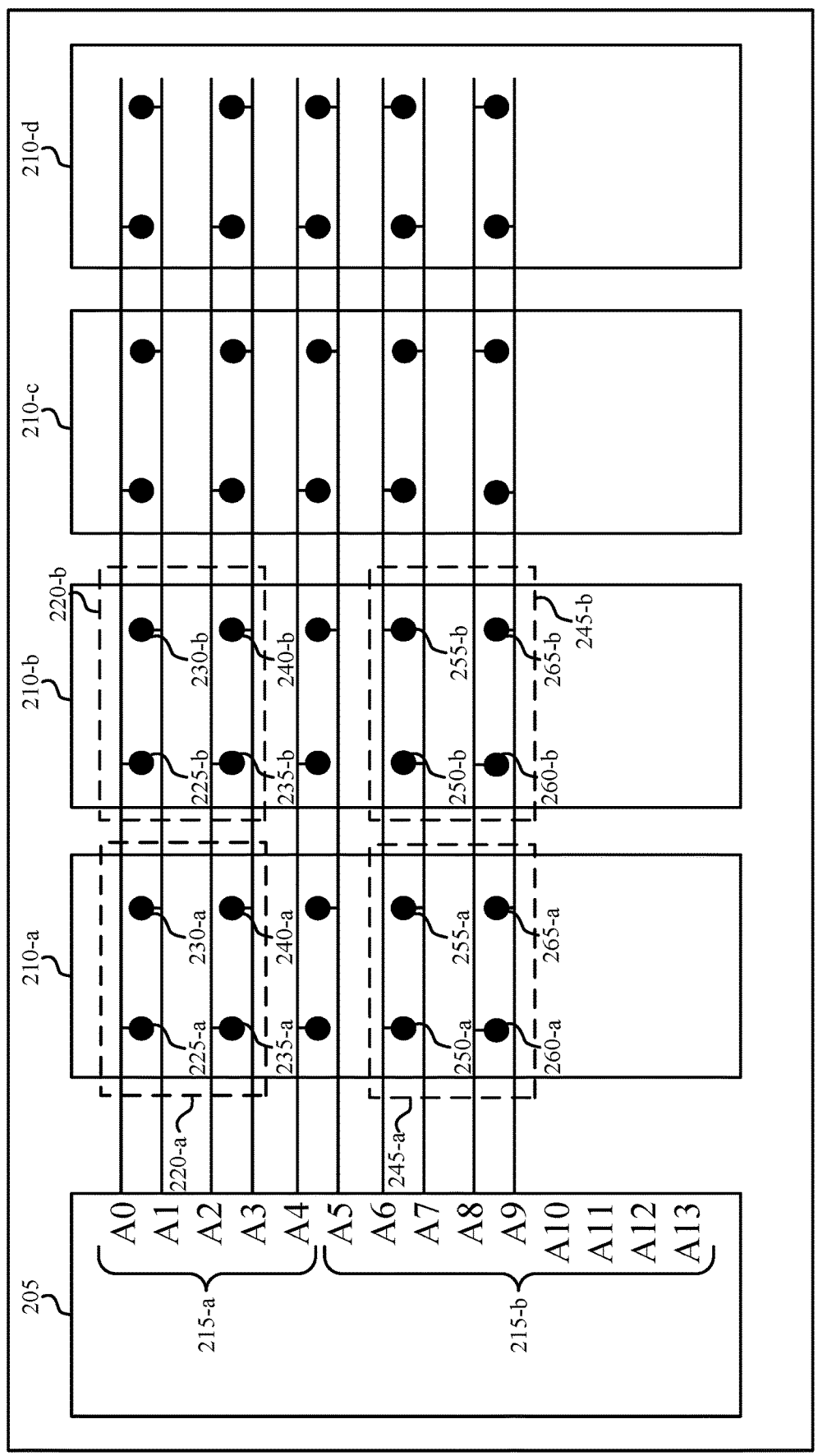
FIG. 2 illustrates an example of a memory system that supports addressing scheme for a memory system in accordance with examples as disclosed herein.

FIG. 2 illustrates an example of a memory system 200 that supports addressing scheme for a memory system in accordance with examples as disclosed herein. The memory system 200 may include a controller 205 (e.g., a register clock driver) coupled with various memory devices 210. The controller 205 may be selectively coupled with one or more memory devices 210 via one or more subsets of signal paths 215 of a CA channel. For example, the signal paths 215 may include a first subset of signal paths 215-*a* (e.g., for communicating a command identifier) and a second subset of signal paths 215-*b* (e.g., for communicating an address identifier). In some cases, the signal paths 215 collectively may be an example of a CA channel described with reference to FIG. 1. Each memory device 210 may include one or more pins that are coupled to one or more signal paths 215. Based on certain signal paths 215 being driven (e.g., driven high), respective pins may be biased and individual memory devices 210 may be entered into a PDA mode. When a memory device 210 is in a PDA mode it may respond to or execute commands associated with PDA mode, where other memory devices that are not in PDA mode may not respond to such commands. The controller 205 may be an example of an external memory controller 120, a device memory controller 155, or a local memory controller 165, or a combination thereof described with reference to FIG. 1.

Each of the memory devices 210 may include one or more arrays of memory cells. For example, each memory device 210 may be an example of a memory device 110 and may include one or more memory arrays 170 as described with reference to FIG. 1. Memory cells of the memory devices 210 may be accessed based on a respective memory address (e.g., an intersection of a row line and a column line).

However, each memory device 210 may not be identified by its own unique address for the memory device. Because memory devices may not be assigned unique identifiers, a controller of a memory system may not be able to address individual memory devices as part of a PDA mode entry command. In such systems, coordination between the CA channel and a DQ channel may be used to cause a memory device to enter a PDA mode. By entering one or more memory devices 210 into a PDA mode, the memory device 210 (including its memory cells) may be accessed exclusively.

The memory devices 210 may be coupled with one or more signal paths 215 via one or more pins according to one or more configurations. Some pins at some pin locations in each memory device may be coupled to the same signal paths. For example, signal paths A0-A5 may be coupled to pins in the same locations in every memory device. Such configurations may allow the memory devices to have certainty about what signals should be received at each pin. Some pins at some pin locations in each memory device may be coupled to different signal paths based on one or more scrambling configurations. For example, signal paths A6-A13 may be coupled to different pins in different pin locations in each memory device. In some cases, each memory device may have a different configuration of couplings between pin locations and signal paths 215. Such configurations may allow the signal paths to carry standard information and may allow the signal paths to also address a specific memory device to enter a PDA mode as part of a PDA mode entry command. The memory system may implement an initialization signal to allow each memory device to determine which signal path is coupled at which pin location.

In some examples, each memory device 210 may include a plurality of pins, and at least one pin of each memory device 210 may be coupled with a respective signal path 215. For example, signal paths A0 through A3 (of the first subset of signal paths 215-a) may be associated with a plurality of pins 220-a of the memory device 210-a. The plurality may include a first pin 225-a that is located in a first position, a second pin 230-a that is located in a second position, a third pin 235-a that is located in a third position, and a fourth pin 240-a that is located in a fourth position. The first pin 225-a may be coupled with A0, the second pin 230-a may be coupled with A1, the third pin 235-a may be coupled with A2, and the fourth pin 240-a may be coupled with A3. In some examples, the memory device 210-a may include additional pins that are coupled with A4. As discussed herein, other memory devices 210 may include a same combination of pins coupled with the signal paths A0 through A3.

Additionally or alternatively, signal paths A6 through A9 (of the second subset of signal paths 215-b) may be associated with a plurality of pins 245-a of the memory device 210-a. The plurality may include a first pin 250-a that is located in a first position, a second pin 255-a that is located in a second position, a third pin 260-a that is located in a third position, and a fourth pin 265-a that is located in a fourth position. The first pin 255-a may be coupled with A6, the second pin 255-a may be coupled with A7, the third pin 260-a may be coupled with A8, and the fourth pin 265-a may be coupled with A9. In some examples, the memory device 210-a may include additional pins that are coupled with A5. As discussed herein, other memory devices 210 may include different combinations of pins coupled with the signal paths A6 through A9 (i.e., the pin-to-signal path configuration may be scrambled).

Each of the signal paths 215 may be caused to be driven by the controller 205 based on a command to be performed on one or more memory devices 210. The first subset of signal paths 215-a (e.g., A0 through A4) may be configured to transmit a command (e.g., a PDA command) to the memory devices 210, and the second subset of signal paths 215-b (e.g., A5 through A13) may be configured to indicate address information associated with the received command. Command and address information may be communicated to a particular memory device 210 based on its configuration of active pins (i.e., which pins are biased based on a respective channel being driven). Certain pins of each memory device 210 may be biased based on respective signal paths being driven. Because signal paths may be scrambled in pairs (e.g., signal paths A6 and A7 and signal paths A8 and A9), an even number of channels of the second subset of signal paths 215-b may be used for addressing. Accordingly, channel A5 may not be used for addressing purposes. In some examples, channel A5 may be used for other purposes such as communicating command information to the memory devices 210.

Because the first subset of signal paths 215-a may be used to communicate the PDA command (and are not used for addressing), a same pin (or pins) of each memory device 210 may be coupled with a same signal path of the first subset of signal paths 215-a. Accordingly, a mapping between each memory device 210 and the first subset of signal paths 215-a may be the same. For example, with respect the memory device, 210-a, the first pin 225-a may be coupled with A0, the second pin 230-a may be coupled with A1, the third pin 235-a may be coupled with A2, and the fourth pin 240-a may be coupled with A3. Similarly, with respect to the memory device 210-b, the first pin 225-b may be coupled with A0, the second pin 230-b may be coupled with A1, the third pin 235-b may be coupled with A2, and the fourth pin 240-b may be coupled with A3. The mapping of pins-to-signal paths may be the same for memory devices 210-c and 210-d, and may be established during a manufacturing process of the memory system 200.

In some examples, the second subset of signal paths 215-b may be initialized. Initializing the second subset of signal paths 215-b may refer to driving a particular subset of the signal paths (e.g., driving the subset of signal paths high). To initialize the signal paths, the memory system 200 may receive a command (e.g., an initialization command) from a host device (or another device, such as a memory controller). The initialization command may indicate certain signal paths to be driven. For example, an initialization command may indicate that even columns (e.g., A6, A8, A10, etc.) are to be driven high. In some examples, the initialization procedure may allow the driver to map pin locations to signal paths. For example, during an initialization procedure, signal paths A6 and A8 may be driven high, which may indicate (e.g., to the controller 205) that the first pin 250-a is coupled with A6 and the third pin 260-a is coupled with A8. This mapping may be used to enter one or more memory devices 210 into a PDA mode.

In order to enter a particular memory device 210 into PDA mode, certain signal paths of the second subset of signal paths 215-b may be driven (e.g., driven high). When the channels are driven, corresponding pins on the memory devices 210 may be biased, indicating to the respective memory device 210 that it is to enter a PDA mode. A memory device 210 may be associated with a unique address based on which pins are biased (e.g., during a PDA entry command). In some cases, each memory device 210 may be configured to look for the same combination of pin locations to be biased to enter a PDA mode. For example, each memory device 210 may enter a PDA mode when pin 250 and pin 260 are biased. The scrambling configurations may be used to ensure that a single memory device is addressed with a PDA entry command is given.

In some examples, the mapping between pins of the memory devices 210 and signal paths of the second subset of signal paths 215-*b* may be scrambled. For example, during a manufacturing process, a different combination of pins of each memory device 210 may be coupled with a different combination of signal paths. As described above with respect to the memory device 210-*a*, the first pin 255-*a* may be coupled with A6, the second pin 255-*a* may be coupled with A7, the third pin 260-*a* may be coupled with A8, and the fourth pin 265-*a* may be coupled with A9. With respect to the memory device 210-*b*, the first pin 255-*b* may be coupled with A7, the second pin 255-*b* may be coupled with A6, the third pin 260-*b* may be coupled with A8, and the fourth pin 265-*b* may be coupled with A9. The memory devices 210-*c* and 210-*d* include different mappings of pins-to-signal paths than the memory devices 210-*a* and 210-*b*. The mappings may be determined by the controller 205 based on an initialization procedure as described above.

When the memory system 200 receives a PDA entry command, the controller 205 (or other device such as a local memory controller) may determine an address of a memory device associated with the command. The address may be indicated by a combination of signal paths (of the second subset of signal paths 215-*b*) to drive. When the associated signal paths are driven, associated pins of each memory device may be biased (e.g., biased to a high voltage). A particular memory device 210 may enter into a PDA mode based on the combination of biased pins. For example, each memory device 210 may be configured to enter a PDA mode based on its first pin (e.g., first pin 250-*a*) and third pin (e.g., third pin 260-*a*) being biased. An example of biasing signal paths A6 and A8 to a high voltage and biasing signal paths A7 and A9 to a low voltage and how that will affect the biases at pin locations based on the scrambling of the connections between pins and signal paths is shown below in Table 2.

TABLE 2

|         | 210-a | 210-b | 210-c | 210-d |
|---------|-------|-------|-------|-------|
| Pin 250 | High  | Low   | High  | Low   |
| Pin 255 | Low   | High  | Low   | High  |
| Pin 260 | High  | High  | Low   | Low   |
| Pin 265 | Low   | Low   | High  | High  |

Table 2 illustrates scenarios in which each memory device 210 may enter a PDA mode. As described above and illustrated in Table 2, any memory device 210 may enter a PDA mode based on its first pin 250 at a first location and its third pin 260 at a third location being biased to a high voltage. Accordingly, when the memory system 200 receives a PDA command that drives the signal paths A6 and A8 to a high voltage, the first pin 250 and the third pin 260 of the memory device 210-*a* may be biased to a high voltage. In such examples, the memory device 210-*a* may determine that it is to enter the PDA mode and may enter the PDA mode.

Similarly, when the memory system 200 receives a PDA command indicating that signal paths A7 and A8 are to be driven to a high voltage, it may result in the first pin 250 and the third pin 260 of the memory device 210-*b* being biased to the high voltage. In such cases, the memory device 210-*b* may determine that it is enter the PDA mode and may enter the PDA mode. When A6 and A9 are driven to a high voltage, the first pin 250 and the third pin 260 of the memory device 210-*c* may be biased to a high voltage. The memory device 210-*c* may determine that it is to enter the PDA mode and may enter the PDA mode. When A7 and A9 are driven to a high voltage, the first pin 250 and the third pin 260 of the memory device 210-*d* may be biased to a high voltage. The memory device 210-*d* may determine that it is to enter the PDA mode and may enter the PDA mode. Accordingly, by scrambling the mapping of pins-to-signal paths of each memory device 210, the memory devices 210 may be associated with respective addresses and may be accessed individually. Although the memory devices 210 may enter a PDA mode based on its first and third pins being biased, any memory device 210 may enter a PDA mode based on any combination of pins being biased.

When some of the second subset of signal paths 215-*b* are biased (e.g., indicating which memory device 210 is to receive a PDA command), the first subset of signal paths 215-*a* may transmit the command (e.g., the PDA command) to the respective memory device 210. In other examples (not shown), signal paths A10 through A13 may also be used for addressing. That is, pin-to-signal path configurations of signal paths A10 through A13 may be scrambled. In some examples, channels A6 through A9 may be scrambled or signal paths A10 through A13 may be scrambled. In other examples, both sets of channels may be scrambled. When both sets of signal paths are scrambled, the memory devices 210 may include additional pins coupled with the signal paths. For example, each memory device 210 may include two pins coupled with each signal path, which may allow for an additional number of unique pin-to-signal path combinations (i.e., an additional number of scramble configurations). Including additional pins may allow for an addressing scheme that utilizes each of signal paths A6 through A13.

The illustrative examples show scrambling configurations for addressing up to four memory devices using four pin-to-signal path configurations. In other examples, any number of memory devices may be addressed using scrambling configurations that use any number of pin-to-signal path configurations. For example, signal paths A6-A13 may be scrambled using signal path pairs to address up to sixteen memory devices. In other examples, signal paths A6-A13 may be scrambled using signal path pairs.

The illustrative examples show scrambling configurations that scramble pin and signal path configurations using signal path pairs. In other examples, different groupings of pins and signal paths may be used. For example, three signal paths and three pin locations may be grouped into a rotating set of connections. In some cases, any number of signal paths and pin locations may be grouped to form configurations.

Once in PDA mode, a respective memory device 210 may receive commands (e.g., from a host device) associated with the PDA mode and may execute such commands. For example, if the memory device 210-*a* is in PDA mode, the memory device 210-*a* could receive and respond to specific commands that would not be responded to by the memory devices 210-*b*, 210-*c*, and 210-*d*. One or more memory cells of the memory device 210-*a* may be accessed, or certain settings (e.g., mode register settings) of the memory device 210-*a* may be configured. Entering one or more memory devices 210 into a PDA mode may allow for individual memory devices to be addressed, thus providing added configurability to a memory system.

Figure 3:
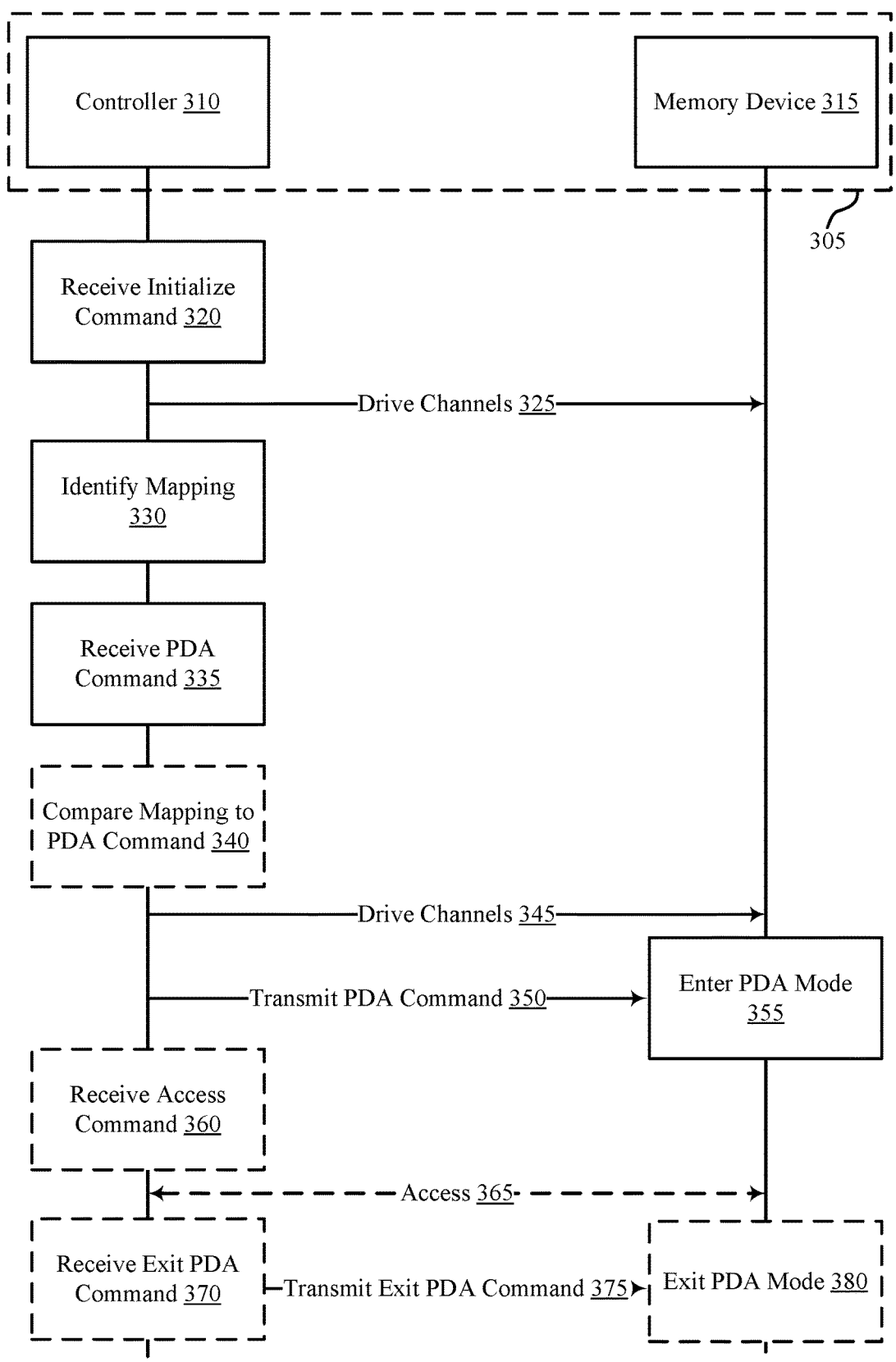
FIG. 3 illustrates an example of a flow diagram that supports addressing scheme for a memory system in accordance with examples as disclosed herein.

FIG. 3 illustrates an example of a flow diagram 300 that supports addressing scheme for a memory system in accordance with examples as disclosed herein. The flow diagram 300 may illustrate operations of one or more components of a memory system 305, which may be an example of the memory system 200 as described with reference to FIG. 2. The flow diagram may show operations between a controller 310 (e.g., a controller 310) and a memory device 315. The memory device 315 may be an example of one or more memory devices 210 as described with reference to FIG. 2. For example, the flow diagram 300 may illustrate the timing at which a memory device 315 undergoes an initialization procedure and receives a PDA command to enter a PDA mode. In some examples, the controller 310 may communicate with a driver to initialize the pins, drive the signal paths, or access the memory device 315.

At step 320, the controller 310 may receive an initialize command. The command may be received from an external device (e.g., external to the memory system 305) such as a host device. The initialize command may indicate that the controller 310 is to drive one or more signal paths in a preconfigured pattern so that the memory device 315 may determine and map which signal paths are coupled with which pin locations in the memory device 315.

At step 325, the controller 310 may drive one or more signal paths (e.g., drive one or more signal paths high) in an initialization pattern. Each signal path may be coupled with respective pins of the memory device 315, thus driving some signal paths may bias some pins of the memory device 315. In some cases, because signal paths may operate in pairs, during an initialization procedure, one signal path of each pair of signal paths may be driven. For example, the memory device 315 may include four pins coupled with four signal paths (e.g., two pairs of signal paths). Accordingly, one signal path of the first pair and one signal path of the second pair may be driven, resulting in two pins of the memory device 315 being biased. In some examples, the controller 310 may initiate driving the signal paths using a driver, such as the controller 205 as described with reference to FIG. 2.

At step 330, the controller 310 may identify mapping between the pins of the memory device 315 and respective signal paths (e.g., signal paths of the second subset of signal paths 215-b as described with reference to FIG. 2). The mapping may indicate which signal path is coupled with which pin location. The mapping may be used when one or more commands are received. For example, the memory device may be able to identify information of a read command or write command by mapping pin locations with the correct signal path of the CA channel Based on the mapping, the controller 310 may know which signal paths to drive in order for the memory device 315 to perform the appropriate command.

At step 335, the controller 310 may receive a PDA command. The command may be received from an external device (e.g., external to the memory system 305) such as a host device. In some cases, the controller 310 may generate the PDA command based on a determination that the memory device 315 should enter the PDA mode. The PDA command may indicate that a memory device of the memory system 305 is to enter a PDA mode. Because the controller 310 may know the mapping of pins-to-signal paths (e.g., based on the initialization and mapping processes), the PDA command may indicate which memory device is to enter a PDA mode by biasing some signal paths to various voltage levels based on the scrambling configurations between pins and signal paths in the various memory devices. In other examples, the PDA command may indicate a particular combination of signal paths to drive in order to enter a memory device (e.g., the memory device 315) into a PDA mode.

At step 340, the controller 310 may optionally compare the mapping between pins and signal paths (e.g., pins of the memory device 315). Because the PDA command may indicate a memory device to enter into PDA mode (e.g., memory device 315), comparing the mapping of pins to signal paths may determine which signal paths are to be driven to enter a particular memory device into a PDA mode. That is, the memory device coupled with the signal paths indicated by the PDA command may receive the PDA command and enter into a PDA mode.

At step 345, the controller 310 may drive (or initiate driving) the signal paths associated with the PDA command. For example, driving signal paths A6 and A8 as described with reference to FIG. 2 may result in a particular combination of pins of the memory device 315 being biased. The particular combination of biased pins may indicate (e.g., to the memory device) that it is to receive the PDA command. Addressing of the PDA command may be indicated by a subset of CA signal paths (e.g., the second subset of signal paths 215-b as described with reference to FIG. 2) and the command may be communicated by a different subset of CA signal paths (e.g., the first subset of signal paths 215-a as described with reference to FIG. 2).

At step 350, the controller 310 may transmit the PDA command. The PDA command may be received by the memory device 315 based its unique address. That is, the memory device 315 may receive the PDA command based on certain pins being coupled with signal paths driven in response to receiving the PDA command. As described with reference to FIG. 2, a first subset of signal paths (e.g., a first subset of signal paths 215-a) may transmit the PDA command to the memory device 315 based on the address indicated by a second subset of signal paths (e.g., a second subset of signal paths 215-b).

At step 355, the memory device 315 may enter a PDA mode. By entering the PDA mode, the memory device 315 may perform operations based on commands that other memory devices of the memory system 305 ignore. This may allow for memory cells of the memory device 315 to be accessed and/or one or more settings of the memory device 315 to be adjusted independent of any other memory devices of the memory system 305.

At step 360, the controller 310 may optionally receive an access command. The command may be received from an external device (e.g., external to the memory system 305) such as a host device. The access command may indicate that the controller 310 is to access the memory device 315 based on it being in a PDA mode. In some examples, the access command may indicate an access operation (e.g., a read operation, a write operation) to be performed on one or more cells of the memory device 315. In other examples, the access command may indicate one or more settings (e.g., a setting of a mode register unique to the memory device 315) to be updated.

At step 365, the controller 310 may optionally initiate an access operation of the memory device 315. The access operation may be based on the received access command. The controller 310 may initiate an access operation (e.g., a read operation, a write operation) on one or more cells of the memory device 315 or the controller may alter one or more settings (e.g., a setting of a mode register) of the memory device 315.

At step 370, the controller 310 may optionally receive a command to exit the PDA mode. Exiting the PDA mode may, for example, allow the memory system 305 to enter a different memory device into PDA mode. At step 375, the controller may optionally transmit the exit PDA command to the memory device 315. At step 380, the memory device 315 may optionally exit the PDA mode.

Figure 4:
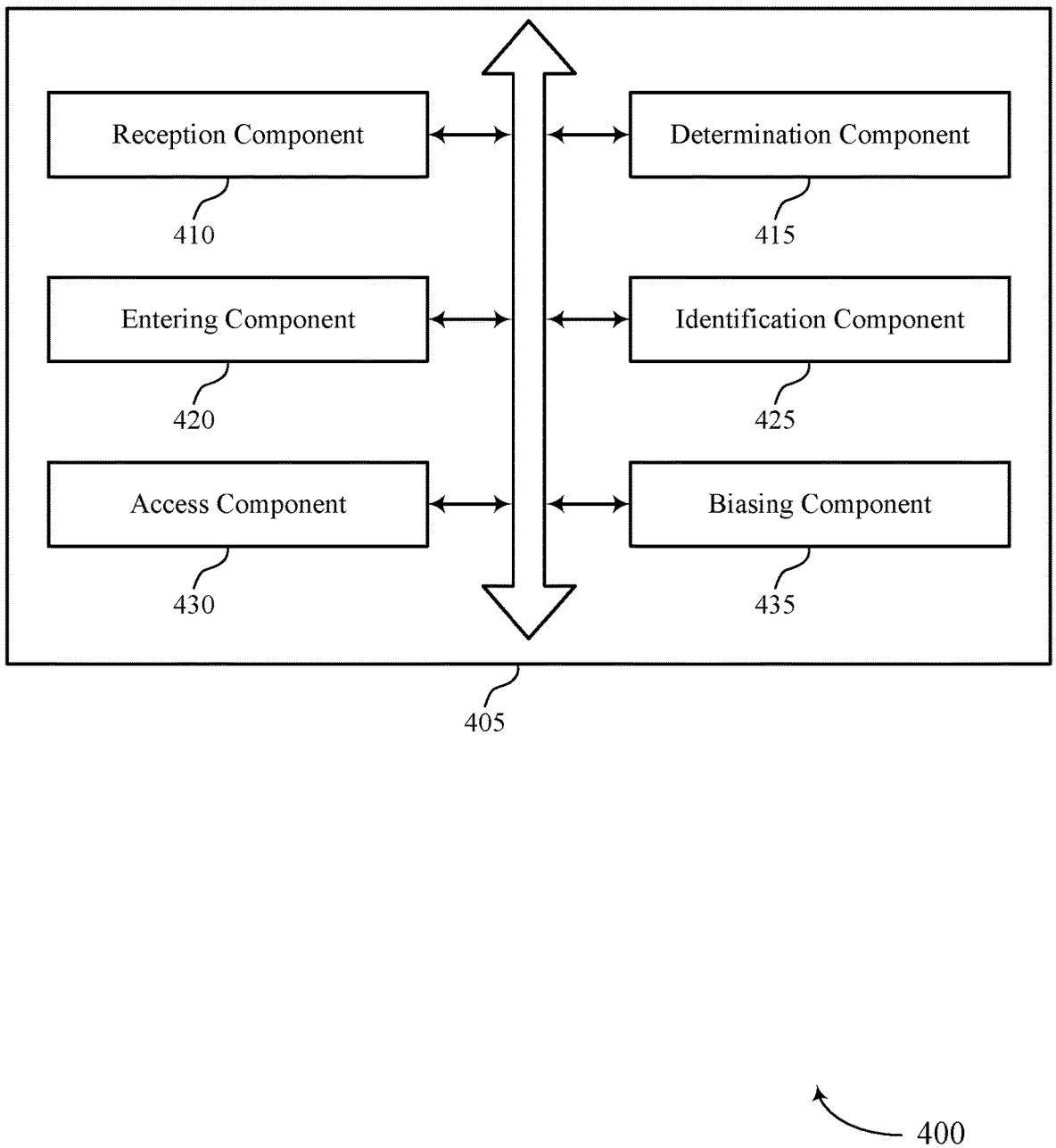
FIG. 4 shows a block diagram of a memory system that supports addressing scheme for a memory system in accordance with examples as disclosed herein.

FIG. 4 shows a block diagram 400 of a memory system 405 that supports addressing scheme for a memory system in accordance with examples as disclosed herein. The memory system 405 may be an example of aspects of a memory system as described with reference to FIGS. 2 and 3. The memory system 405 may include a reception component 410, a determination component 415, an entering component 420, an identification component 425, an access component 430, and a biasing component 435. Each of these modules may communicate, directly or indirectly, with one another (e.g., via one or more buses).

The reception component 410 may receive, using a set of signal paths, a command for causing a first memory device of a set of memory devices of a memory system to enter a per-device addressability mode, the command including an address of the first memory device, where the first memory device includes a first set of pins coupled with the set of signal paths in a first configuration and a second memory device including a second set of pins coupled with the set of signal paths in a second configuration. In some examples, the reception component 410 may receive an initialization command for mapping a first subset of signal paths of a CA channel to pins of respective memory devices of the memory system.

In some examples, the reception component 410 may receive, using a second subset of signal paths of the CA channel, a command for the memory device of the memory system to enter a per-device addressability mode. In some examples, the reception component 410 may receive, using the first subset of signal paths of the CA channel, an address for the memory device of the memory system to enter the per-device addressability mode. In some examples, the reception component 410 may receive, at the memory system, a command for accessing a memory device of the set of memory devices. In some examples, the reception component 410 may receive a second command for causing the second memory device to enter the per-device addressability mode.

The determination component 415 may determine that the address of the first memory device is indicated by the command based on receiving the command. In some examples, the determination component 415 may determine that the address of the second memory device is indicated by a second command based on receiving the command. In some cases, the first configuration includes a first pin of the first set of pins being coupled with a first signal path of the set of signal paths and a second pin of the first set of pins being coupled with a second signal path of the set of the signal paths. In some cases, the second configuration includes the first pin being coupled with the second signal path and the second pin being coupled with the first signal path.

The entering component 420 may enter, by the first memory device, into the per-device addressability mode based on determining that the address of the first memory device is indicated by the command. In some examples, entering, by the second memory device, the per-device addressability mode, where entering the second memory device into the per-device addressability mode includes executing one or more commands associated with the per-device addressability mode.

The identification component 425 may identify, by a memory device, a mapping that indicates which pins of the memory device are coupled with which signal paths of the first subset of signal paths based on receiving the initialization command. In some examples, the identification component 425 may identify a subset of the first set of pins that are biased to a first voltage, where determining that the address of the first memory device is indicated by the command is based on the first set of pins being biased to the first voltage. In some examples, the identification component 425 may compare a second subset of the first set of pins for indicating the first memory device with the subset of the first set of pins biased during the command. In some cases, the subset of the first set of pins are identified without reference to the set of signal paths coupled with the first set of pins.

The access component 430 may access the first memory device based on the first memory device entering the per-device addressability mode. In some examples, access the first memory device includes configuring a mode register of the first memory device or accessing one or more memory cells associated with the first memory device.

The biasing component 435 may bias a first subset of pins of the memory device to a first voltage at a first time based on receiving the initialization command, where identifying the mapping is based on biasing the first subset of pins to the first voltage at the first time. In some examples, the biasing component 435 may bias a second subset of pins of the first memory device different than the first subset of pins to the first voltage at a second time different than the first time based on receiving the initialization command, where identifying the mapping is based on biasing the first subset of pins to the first voltage at the first time and biasing the second subset of pins to the first voltage at the second time.

In some examples, the biasing component 435 may bias a first signal path of the first pair to a first voltage at a first time based on receiving the initialization command. In some examples, the biasing component 435 may bias the second signal path of the first pair to a second voltage at the first time based on receiving the initialization command where identifying the mapping is based on biasing the first signal path and the second signal path. In some cases, the mapping that indicates which pins of the memory device are coupled with which signal paths of the first subset of signal paths is based on a value of at least two pins of the subset of pins that are biased to the first voltage.

Figure 5:
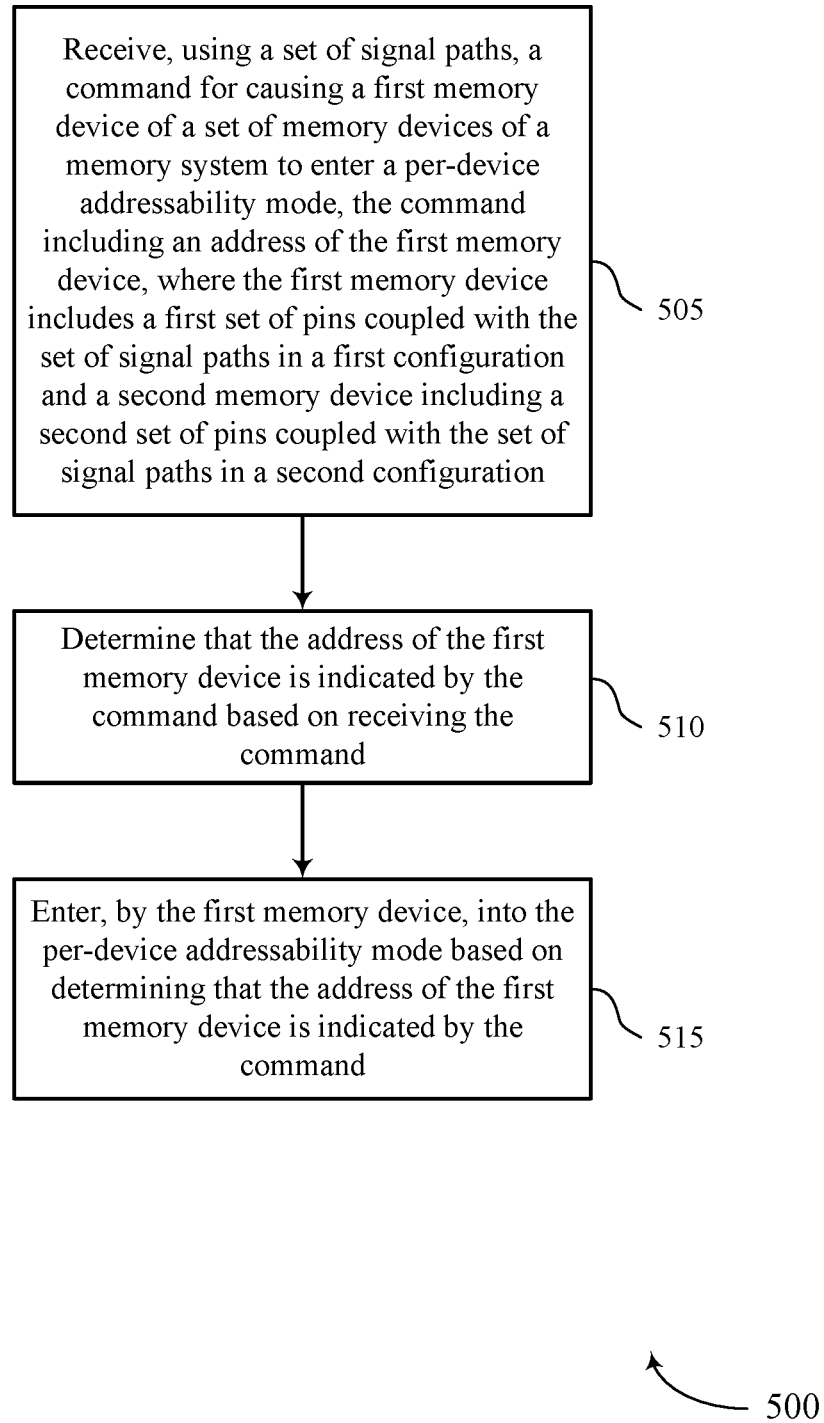
FIGS. 5 and 6 show flowcharts illustrating a method or methods that support addressing scheme for a memory system in accordance with examples as disclosed herein.

FIG. 5 shows a flowchart illustrating a method or methods 500 that supports addressing scheme for a memory system in accordance with examples as disclosed herein. The operations of method 500 may be implemented by a memory system or its components as described herein. For example, the operations of method 500 may be performed by a memory system as described with reference to FIG. 4. In some examples, a memory system may execute a set of instructions to control the functional elements of the memory system to perform the described functions. Additionally or alternatively, a memory system may perform aspects of the described functions using special-purpose hardware.

At 505, the memory system may receive, using a set of signal paths, a command for causing a first memory device of a set of memory devices of a memory system to enter a per-device addressability mode, the command including an address of the first memory device, where the first memory device includes a first set of pins coupled with the set of signal paths in a first configuration and a second memory device including a second set of pins coupled with the set of signal paths in a second configuration. The operations of 505 may be performed according to the methods described herein. In some examples, aspects of the operations of 505 may be performed by a reception component as described with reference to FIG. 4.

At 510, the memory system may determine that the address of the first memory device is indicated by the command based on receiving the command. The operations of 510 may be performed according to the methods described herein. In some examples, aspects of the operations of 510 may be performed by a determination component as described with reference to FIG. 4.

At 515, the first memory device may enter into the per-device addressability mode based on determining that the address of the first memory device is indicated by the command. The operations of 515 may be performed according to the methods described herein. In some examples, aspects of the operations of 515 may be performed by an entering component as described with reference to FIG. 4.

In some examples, an apparatus as described herein may perform a method or methods, such as the method 500. The apparatus may include features, means, or instructions (e.g., a non-transitory computer-readable medium storing instructions executable by a processor) for receiving, using a set of signal paths, a command for causing a first memory device of a set of memory devices of a memory system to enter a per-device addressability mode, the command including an address of the first memory device, where the first memory device includes a first set of pins coupled with the set of signal paths in a first configuration and a second memory device including a second set of pins coupled with the set of signal paths in a second configuration, determining that the address of the first memory device is indicated by the command based on receiving the command, and entering, by the first memory device, into the per-device addressability mode based on determining that the address of the first memory device is indicated by the command.

Some examples of the method 500 and the apparatus described herein may further include operations, features, means, or instructions for identifying a subset of the first set of pins that may be biased to a first voltage, where determining that the address of the first memory device may be indicated by the command may be based on the first set of pins being biased to the first voltage.

In some examples of the method 500 and the apparatus described herein, the subset of the first set of pins may be identified without reference to the set of signal paths coupled with the first set of pins.

In some examples of the method 500 and the apparatus described herein, determining that the address of the first memory device may be indicated by the command may include operations, features, means, or instructions for comparing a second subset of the first set of pins for indicating the first memory device with the subset of the first set of pins biased during the command.

In some examples of the method 500 and the apparatus described herein, the first configuration includes a first pin of the first set of pins being coupled with a first signal path of the set of signal paths and a second pin of the first set of pins being coupled with a second signal path of the set of the signal paths, and the second configuration includes the first pin being coupled with the second signal path and the second pin being coupled with the first signal path.

Some examples of the method 500 and the apparatus described herein may further include operations, features, means, or instructions for receiving, at the memory system, a command for accessing a memory device of the set of memory devices, and accessing the first memory device based on the first memory device entering the per-device addressability mode.

In some examples of the method 500 and the apparatus described herein, accessing the first memory device may include operations, features, means, or instructions for configuring a mode register of the first memory device or accessing one or more memory cells associated with the first memory device.

Some examples of the method 500 and the apparatus described herein may further include operations, features, means, or instructions for receiving a second command for causing the second memory device to enter the per-device addressability mode, determining that the address of the second memory device may be indicated by a second command based on receiving the command, and entering, by the second memory device, the per-device addressability mode, where entering the second memory device into the per-device addressability mode includes executing one or more commands associated with the per-device addressability mode.

Figure 6:
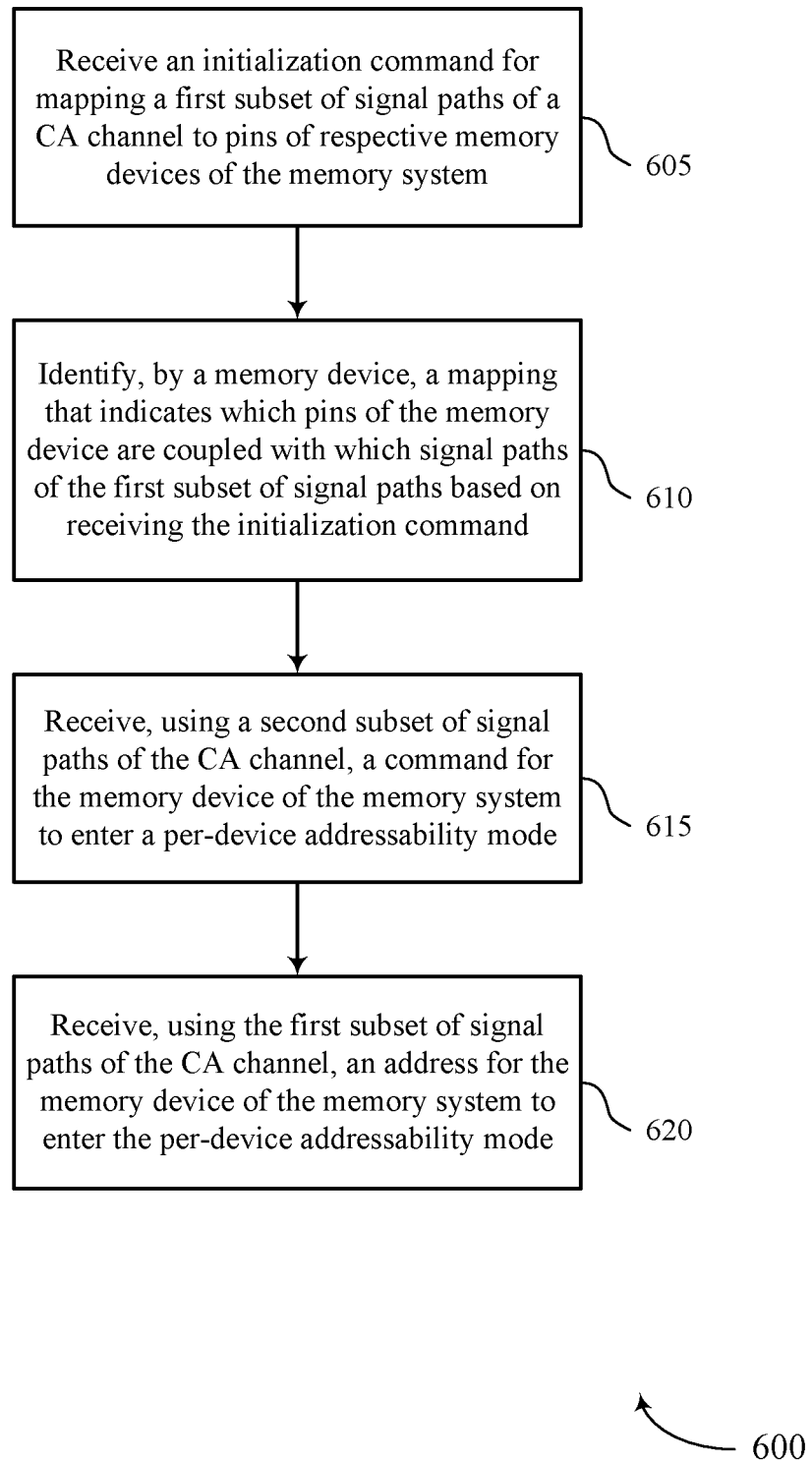

FIG. 6 shows a flowchart illustrating a method or methods 600 that supports addressing scheme for a memory system in accordance with examples as disclosed herein. The operations of method 600 may be implemented by a memory system or its components as described herein. For example, the operations of method 600 may be performed by a memory system as described with reference to FIG. 4. In some examples, a memory system may execute a set of instructions to control the functional elements of the memory system to perform the described functions. Additionally or alternatively, a memory system may perform aspects of the described functions using special-purpose hardware.

At 605, the memory system may receive an initialization command for mapping a first subset of signal paths of a CA channel to pins of respective memory devices of the memory system. The operations of 605 may be performed according to the methods described herein. In some examples, aspects of the operations of 605 may be performed by a reception component as described with reference to FIG. 4.

At 610, a memory device may identify a mapping that indicates which pins of the memory device are coupled with which signal paths of the first subset of signal paths based on receiving the initialization command. The operations of 610 may be performed according to the methods described herein. In some examples, aspects of the operations of 610 may be performed by an identification component as described with reference to FIG. 4.

At 615, the memory system may receive, using a second subset of signal paths of the CA channel, a command for the memory device of the memory system to enter a per-device addressability mode. The operations of 615 may be performed according to the methods described herein. In some examples, aspects of the operations of 615 may be performed by a reception component as described with reference to FIG. 4.

At 620, the memory system may receive, using the first subset of signal paths of the CA channel, an address for the memory device of the memory system to enter the per-device addressability mode. The operations of 620 may be performed according to the methods described herein. In some examples, aspects of the operations of 620 may be performed by a reception component as described with reference to FIG. 4.

In some examples, an apparatus as described herein may perform a method or methods, such as the method 600. The apparatus may include features, means, or instructions (e.g., a non-transitory computer-readable medium storing instructions executable by a processor) for receiving an initialization command for mapping a first subset of signal paths of a CA channel to pins of respective memory devices of the memory system, identifying, by a memory device, a mapping that indicates which pins of the memory device are coupled with which signal paths of the first subset of signal paths based on receiving the initialization command, receiving, using a second subset of signal paths of the CA channel, a command for the memory device of the memory system to enter a per-device addressability mode, and receiving, using the first subset of signal paths of the CA channel, an address for the memory device of the memory system to enter the per-device addressability mode.

Some examples of the method 600 and the apparatus described herein may further include operations, features, means, or instructions for biasing a first subset of pins of the memory device to a first voltage at a first time based on receiving the initialization command, where identifying the mapping may be based on biasing the first subset of pins to the first voltage at the first time.

Some examples of the method 600 and the apparatus described herein may further include operations, features, means, or instructions for biasing a second subset of pins of the first memory device different than the first subset of pins to the first voltage at a second time different than the first time based on receiving the initialization command, where identifying the mapping may be based on biasing the first subset of pins to the first voltage at the first time and biasing the second subset of pins to the first voltage at the second time.

In some examples of the method 600 and the apparatus described herein, the mapping that indicates which pins of the memory device may be coupled with which signal paths of the first subset of signal paths may be based on a value of at least two pins of the subset of pins that may be biased to the first voltage.

In some examples of the method 600 and the apparatus described herein, the first subset of signal paths of the CA channel may include operations, features, means, or instructions for biasing a first signal path of the first pair to a first voltage at a first time based on receiving the initialization command, and biasing the second signal path of the first pair to a second voltage at the first time based on receiving the initialization command where identifying the mapping may be based on biasing the first signal path and the second signal path.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a set of memory devices, each of the set of memory devices including a set of pins configured for coupling with signal paths of a CA channel, a first subset of signal paths of the CA channel coupled with the set of memory devices using a same configuration of pins in each memory device, the first subset of signal paths configured to receive a command for entering a per-device addressability mode, and a second subset of signal paths of the CA channel coupled with the set of memory devices using one or more different configurations of pins in each memory device, the second subset of signal paths configured to receive an address of a memory device for entering the per-device addressability mode.

In some examples, a first memory device including a first pin coupled with a first signal path of the second subset of signal paths of the CA channel, and a second memory device including a second pin coupled with the second signal path of the second subset of signal paths of the CA channel, where the first pin of the first memory device may be different than the second pin of the second memory device. In some examples, the first pin and the second pin may be biased to a first voltage.

In some examples, an address of the first memory device in the command for entering a per-device addressability mode may be identified based on one or more pins, coupled with the second subset of signal paths, being biased without reference to which pin may be coupled with which signal path. In some examples, the first memory device and the second memory device may be configured to receive the command for entering the per-device addressability mode based on a match between a respective address of the memory device and the received address for entering the per-device addressability mode.

In some examples, a set of memory devices that each include a respective subset of pins coupled with the second subset of signal paths of the CA channel, where each memory device includes a different combination of pins that may be coupled with each signal path of the second subset of signal paths. In some examples, a first signal path of the first subset of signal paths may be coupled with a first pin at a first location of the memory device and a second signal path of the first subset of signal paths may be coupled with a second pin at a second location of the memory device, and the first signal path may be coupled with a third pin at the second location of a second memory device and the second signal path may be coupled with a fourth pin at the first location of the second memory device.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
receiving, at a memory device comprising a plurality of pins, a command for entering a per-device addressability mode, wherein the command is received via at least one of a plurality of signal paths and comprises an address of the memory device, and wherein a first subset of the plurality of pins of the memory device are coupled with a first subset of a plurality of signal paths in a first configuration and a second subset of the plurality of pins of the memory device are coupled with a second subset of the plurality of signal paths in a second configuration;
determining that the address of the memory device is indicated by the command based at least in part on receiving the command; and
entering into the per-device addressability mode based at least in part on determining that the address of the memory device is indicated by the command.

2. The method of claim 1, further comprising:
receiving, at a second memory device, a second command for entering the per-device addressability mode, wherein the second command is received via at least one of the plurality of signal paths and comprises an address of the second memory device, and wherein the second memory device comprises a plurality of pins coupled with the plurality of signal paths in a third configuration that is different than the second configuration;
determining that the address of the second memory device is indicated by the second command based at least in part on receiving the second command; and
entering into the per-device addressability mode based at least in part on determining that the address of the second memory device is indicated by the second command.

3. The method of claim 2, wherein the first subset of the plurality of pins are located in a first position of the memory device and the second memory device comprises a third subset of the plurality of pins located in a first position of the second memory device, and wherein the first subset of the plurality of signal paths are coupled with the first subset of the plurality of pins and the third subset of the plurality of pins.

4. The method of claim 3, wherein the second subset of the plurality of pins are located in a second position of the memory device, wherein the second memory device comprises a fourth subset of the plurality of pins located in a second position of the second memory device, and wherein the fourth subset of the plurality of pins are coupled with the second subset of the plurality of signal paths in the third configuration.

5. The method of claim 4, wherein the first subset of the plurality of pins and the third subset of the plurality of pins are configured to receive one or more commands for the respective memory device, and wherein the second subset of the plurality of pins and the fourth subset of the plurality of pins are configured to receive address information for the respective memory device.

6. The method of claim 1, wherein determining that the address of the memory device is indicated by the command comprises:
determining that one or more pins of the plurality of pins are biased to a first voltage based at least in part on receiving the command.

7. The method of claim 1, wherein:
the second configuration comprises a first pin of the plurality of pins being coupled with a first signal path of the second subset of the plurality of signal paths and a second pin of the plurality of pins being coupled with a second signal path of the second subset of the plurality of signal paths.

8. The method of claim 1, further comprising:
receiving, at the memory device after entering into the per-device addressability mode, a command for accessing the memory device; and
accessing the memory device based at least in part on receiving the command and the memory device being in the per-device addressability mode.

9. An apparatus, comprising:
a memory device comprising a plurality of pins configured for coupling with signal paths of a command/address (CA) channel;
a first subset of signal paths of the CA channel coupled with a first subset of the plurality of pins of the memory device in a first configuration; and
a second subset of signal paths of the CA channel coupled with a second subset of the plurality of pins of the memory device in a second configuration, wherein the second subset of signal paths of the CA channel is configured to receive address of the memory device for entering a per-device addressability mode.

10. The apparatus of claim 9, further comprising:
a second memory device comprising a plurality of pins configured for coupling with signal paths of the CA channel, wherein:
the first subset of signal paths of the CA channel are coupled with a third subset of the plurality of pins of the second memory device; and
the second subset of signal paths of the CA channel are coupled with a fourth subset of the plurality of pins of the second memory device in a third configuration different than the second configuration, the second subset of signal paths of the CA channel configured to receive an address of the second memory device for entering the per-device addressability mode.

11. The apparatus of claim 10, wherein the first subset of the plurality of pins and the third subset of the plurality of pins each comprise pins in a same respective location of the memory device and the second memory device.

12. The apparatus of claim 10, wherein the second subset of the plurality of pins and the fourth subset of the plurality of pins comprise at least one pin in a different respective location of the memory device and the second memory device.

13. The apparatus of claim 9, wherein the memory device is configured to receive a command for entering the per-device addressability mode via the first subset of signal paths of the CA channel, and wherein the memory device is configured to identify the address of the memory device based at least in part on the second subset of the plurality of pins being biased to a first voltage.

14. The apparatus of claim 9, wherein one or more memory cells of the memory device are configured to be accessed based at least in part on the memory device receiving a command for accessing the memory device and the memory device entering the per-device addressability mode.

15. An apparatus, comprising:
a memory device; and
a controller coupled with the memory device, wherein the controller is operable to cause the apparatus to:

receive, at the memory device comprising a plurality of pins, a command for entering a per-device addressability mode, wherein the command is received via at least one of a plurality of signal paths and comprises an address of the memory device, and wherein a first subset of the plurality of pins of the memory device are coupled with a first subset of a plurality of signal paths in a first configuration and a second subset of the plurality of pins of the memory device is coupled with a second subset of the plurality of signal paths in a second configuration;

determine that the address of the memory device is indicated by the command based at least in part on receiving the command; and enter into the per-device addressability mode based at least in part on determining that the address of the memory device is indicated by the command.

16. The apparatus of claim 15, further comprising:
a second memory device; and
a second controller coupled with the second memory device, wherein the second controller is operable to cause the apparatus to:

receive, at the second memory device, a second command for entering the per-device addressability mode, wherein the second command is received via at least one of the plurality of signal paths and comprises an address of the second memory device, and wherein the second memory device comprises a plurality of pins coupled with the plurality of signal paths in a third configuration that is different than the second configuration;

determine that the address of the second memory device is indicated by the second command based at least in part on receiving the second command; and enter into the per-device addressability mode based at least in part on determining that the address of the second memory device is indicated by the second command.

17. The apparatus of claim 16, wherein the first subset of the plurality of pins are located in a first position of the memory device and the second memory device comprises a third subset of the plurality of pins located in a first position of the second memory device, and wherein the first subset of the plurality of signal paths are coupled with the first subset of the plurality of pins and the third subset of the plurality of pins.

18. The apparatus of claim 17, wherein the second subset of the plurality of pins are located in a second position of the memory device, wherein the second memory device comprises a fourth subset of the plurality of pins located in a second position of the second memory device, and wherein the fourth subset of the plurality of pins are coupled with the second subset of the plurality of signal paths in the third configuration.

19. The apparatus of claim 18, wherein the first subset of the plurality of pins and the third subset of the plurality of pins are configured to receive one or more commands for the respective memory device, and wherein the second subset of the plurality of pins and the fourth subset of the plurality of pins are configured to receive address information for the respective memory device.

20. The apparatus of claim 15 wherein, to determine that the address of the memory device is indicated by the command, the controller is operable to cause the apparatus to:

determine that one or more pins of the plurality of pins are biased to a first voltage based at least in part on receiving the command.

* * * * *